United States Patent
Anselmann et al.

(10) Patent No.: US 10,479,722 B2
(45) Date of Patent: Nov. 19, 2019

(54) PROCESS FOR PRODUCING STRUCTURED COATINGS

(71) Applicant: Evonik Degussa GmbH, Essen (DE)

(72) Inventors: Ralf Anselmann, Luedinghausen (DE); Christian Brinkmoeller, Duelmen (DE); Arne Hoppe, Essen (DE); Sonja Merkulov, Marl (DE); Gerhard Renner, Stockstadt am Rhein (DE)

(73) Assignee: Evonik Degussa GmbH, Essen (DE)

( * ) Notice: Subject to any disclaimer, the term of this patent is extended or adjusted under 35 U.S.C. 154(b) by 268 days.

(21) Appl. No.: 15/510,393

(22) PCT Filed: Sep. 1, 2015

(86) PCT No.: PCT/EP2015/069884
§ 371 (c)(1),
(2) Date: Mar. 10, 2017

(87) PCT Pub. No.: WO2016/037887
PCT Pub. Date: Mar. 17, 2016

(65) Prior Publication Data
US 2017/0305784 A1 Oct. 26, 2017

(30) Foreign Application Priority Data
Sep. 12, 2014 (DE) .......................... 10 2014 218 300

(51) Int. Cl.
*C03C 17/00* (2006.01)
*C09D 183/04* (2006.01)
(Continued)

(52) U.S. Cl.
CPC .............. *C03C 17/007* (2013.01); *C09D 7/61* (2018.01); *C09D 183/04* (2013.01); *G03F 7/11* (2013.01);
(Continued)

(58) Field of Classification Search
CPC .............. C03C 17/007; C03C 2217/45; C03C 2217/485; C03C 2218/113;
(Continued)

(56) References Cited

U.S. PATENT DOCUMENTS

| 5,766,680 A | 6/1998 | Schmidt et al. |
| 5,858,462 A | 1/1999 | Yamazaki |

(Continued)

FOREIGN PATENT DOCUMENTS

| DE | 197 37 475 A1 | 3/1999 |
| DE | 10 2012 109 808 A1 | 6/2014 |

(Continued)

OTHER PUBLICATIONS

SiSi Silicones, http://www.powerchemical.net/silanes/5411.html, last visited Mar. 20, 2019.*

(Continued)

*Primary Examiner* — James M Mellott
(74) *Attorney, Agent, or Firm* — Grüneberg and Myers PLLC

(57) ABSTRACT

The present invention, relates, to a process, for producing structured coatings, in which a coating composition comprising at least one inorganic binder, at least one oxide pigment which, after addition of a mixture consisting of 15 ml of 1 M oxalic acid and 15 ml of 20% aqueous hydrochloric acid based on 1 g of substance, under standard conditions, leads to a temperature rise of at least 4° C., and at least one solvent is applied to a substrate, the resulting coating composition film is partially coated with a photoresist and the substrate coated with the coating composition and the photoresist is treated with an acid, to the structured layers obtainable by the process and to the use thereof.

15 Claims, 3 Drawing Sheets

(51) Int. Cl.
*C23C 18/12* (2006.01)
*C09D 7/61* (2018.01)
*G03F 7/11* (2006.01)
*G03F 7/16* (2006.01)
*G03F 7/20* (2006.01)
*G03F 7/32* (2006.01)
*G03F 7/42* (2006.01)
*B05D 1/32* (2006.01)
*C08K 3/22* (2006.01)

(52) U.S. Cl.
CPC ............. *G03F 7/162* (2013.01); *G03F 7/168* (2013.01); *G03F 7/2004* (2013.01); *G03F 7/32* (2013.01); *G03F 7/426* (2013.01); *C03C 2217/40* (2013.01); *C03C 2217/45* (2013.01); *C03C 2217/485* (2013.01); *C03C 2218/113* (2013.01); *C03C 2218/33* (2013.01); *C03C 2218/34* (2013.01); *C08K 3/22* (2013.01); *C08K 2003/2265* (2013.01)

(58) Field of Classification Search
CPC ............ C03C 2218/33; C03C 2218/34; C03C 2217/40; G03F 7/426; G03F 7/32; G03F 7/11; G03F 7/162; G03F 7/168; G03F 7/2004; C09D 7/1216; C09D 183/04; C08K 2003/2265; C08K 3/22; C23C 18/1212; C23C 18/122; C23C 18/1254; C23C 18/127; B05D 1/322; B05D 2203/35

See application file for complete search history.

(56) References Cited

U.S. PATENT DOCUMENTS

| | | | |
|---|---|---|---|
| 5,907,008 A | * | 5/1999 | Nakano ............... C08K 3/22 524/430 |
| 6,329,456 B1 | | 12/2001 | Okibe et al. |
| 6,361,868 B1 | | 3/2002 | Bier et al. |
| 2013/0196497 A1 | * | 8/2013 | Shimada ............ C09K 13/06 438/591 |
| 2015/0037507 A1 | | 2/2015 | Bockmeyer et al. |

FOREIGN PATENT DOCUMENTS

| | | |
|---|---|---|
| EP | 365027 A2 | 4/1990 |
| EP | 0 740 183 B1 | 2/2002 |
| WO | WO 97/06896 A1 | 2/1997 |

OTHER PUBLICATIONS

International Search Report dated Feb. 12, 2016 in PCT/EP2015/069884 (submitting English language translation only).

* cited by examiner

PROCESS FOR PRODUCING STRUCTURED COATINGS

BACKGROUND OF THE INVENTION

Field of the Invention

The invention relates to a process for producing structured coatings. The invention especially relates to a process for producing optically dense, thermally stable, nonconductive, structured coatings. The present invention likewise relates to the structured coatings producible by the process according to the invention.

Discussion of the Background

Structured coatings are of significance for many technical fields of use. Optically dense, nonconductive structured coatings are essential for many applications in semiconductor technology. Especially for the production of displays, optically dense, nonconductive coatings are required, in order to frame the edge of the display, protect electronic components from light and/or serve for pixel separation of the colour filters. The coating which achieves the above objects—since they often lead to black coatings—is referred to as black matrix. However, they may in principle have any desired colour. Preferably, black matrices, however, are black or white.

The prior art discloses various processes for producing structured coatings, especially for producing black matrices.

EP 0 762 996 A1 discloses a process for producing structured coatings, in which the structuring is produced by embossing tools. However, this process is not applicable to finely structured coatings as required, for example, in semiconductor technology.

For example, black matrices can also be produced by deposition of chromium, especially via sputtering (EP 0 740 183 A1). However, this method has the disadvantage that corresponding processes are very complex in apparatus terms and require large constructions, and integration into processes for producing displays is very complex. A further disadvantage of the use of chromium is that it is a heavy metal and hence environmentally harmful, and is very costly to dispose of.

Structured coatings or black matrices can also be produced in principle via colouring with an organic dye (EP 0 740 183 A1). However, coating compositions comprising an organic dye are unsuitable for achievement of structured coatings having a high colour depth and homogeneous colour distribution. Black coatings in particular cannot be produced with these solutions, since there are no organic dyes to date that lead to deep black coatings. Coating compositions comprising mixtures of different dyes also have the disadvantage of leading to inadequate colour depth. An additional result is disadvantageous inhomogeneous colourings. Coatings comprising organic dyes are also incapable of withstanding temperatures as often used in display production. For this reason, solutions comprising organic dyes have not led to any commercial use to date in display production.

Customary printing methods which use coating compositions comprising colouring agents that are not organic dyes still cannot be used to date to produce sufficiently finely structured coatings and especially not sufficiently sharply bounded black matrices. One means of producing black matrices is based, for example, on the use of a coating composition comprising a binder and an inorganic pigment (EP 0 740 183 A1). The pigment used may be be carbon black (i.e. pigment black). However, carbon black is disadvantageous since corresponding coatings can become conductive. Alternatively, metal oxides, especially spinel colour pigments, are also used. Among these, particular preference is given to spinel colour pigments, since they can also be used to produce nonconductive coatings from coating compositions comprising high pigment concentrations. In addition, pigment blacks and many other pigments can be dispersed only with difficulty or have a tendency to coagulate, which again has an adverse effect on the quality of the black matrix layer. Finally, spinel pigments are very thermally stable and can—unlike pigment blacks and non-spinel pigments in some cases even not be formed until they are within the cured coatings (Silva et al., Journal of Magnetism and Magnetic Materials, 272-276 (2004) e 1851-e1853). The colour pigments may also be surface-treated (cf., for example, DE 40 14 928 C1 and U.S. Pat. No. 6,136,083 A). However, it is still not possible by the processes that use metal oxide pigments and are known to date to produce sufficiently finely structured coatings.

Finally, structured coatings or black matrices can also be produced by selective conversion of photosensitive coating compositions comprising a black pigment (for example carbon black). However, this process too leads to inferior coatings, especially because of incomplete conversion at high pigment contents. EP 0 740 183 A1 discloses a process for producing structured coatings, in which a coating composition comprising a black compound oxide pigment comprising at least two metal oxides, an inorganic binder and a photosensitive resin is applied to a substrate, and the coating composition applied is irradiated with a mercury vapour lamp through a photomask, developed, washed and optionally post-heated further. However, the use of photosensitive resins based on organic systems has the disadvantage that the layers produced using them cannot be exposed to the high temperatures that are advantageously used in display production.

SUMMARY OF THE INVENTION

The problem addressed in the present document is therefore that of avoiding the disadvantages of the prior art. More particularly, the problem addressed in the present document is that of providing a process for producing structured coatings, with which very fine structured coatings can be achieved and which uses colouring coating compositions without organic dyes, binders and photosensitive resins.

This object is achieved by a process for producing structured coatings, in which a coating composition comprising at least one inorganic binder, at least one oxide pigment which, after addition of a mixture consisting of 15 ml of 1 M oxalic acid and 15 ml of 20% aqueous hydrochloric acid based on 1 g of substance, under standard conditions (SATP: 25° C., 1.013 bar), leads to a temperature rise of at least 4° C., and at least one solvent is applied to a substrate, the resulting coating composition film is partially coated with a photoresist and the substrate coated with the coating composition and the photoresist is treated with an acid.

The processes according to the invention for producing structured coatings are suitable in principle for production of any desired structured coatings. Preferably, however, the coatings producible thereby are structured coatings from the field of semiconductor technology. More preferably, the process according to the invention is a process for producing structured black matrices. It has been found that, surprisingly, it is thus possible to produce extremely fine structures (having widths of <10 μm). In addition, the process according to the invention has the advantage that it can be operated even with relatively weak acids. The use of toxic etchants, for example hydrofluoric acid, can thus be avoided.

In the process according to the invention, a coating composition is applied to a substrate. In principle, any desired substrate is suitable for the process according to the invention. For subsequent use in semiconductor technology, however, preference is given to substrates selected from glass, silicon, silicon dioxide, a metal oxide or transition metal oxide, a metal, or a polymeric material, especially PI, PEN, PEEK, PC or PET. The substrate may also be untreated or treated. The term "treated substrate" additionally includes not just treatments made to produce desired surface properties, but also treatments made to produce desired technical properties (especially to produce desired electronic properties, for example treatments for application of display structures, for example pixels).

The coating composition which is applied to the substrate comprises at least one inorganic binder, at least one oxide pigment and at least one solvent. It may consequently have still further composition constituents. Preferably, the coating composition of the invention, however, consists exclusively of one or more binders, one or more oxide pigments and one or more solvents. In order to produce structured coatings of particularly good suitability for high-temperature applications, the process according to the invention uses coating compositions consisting exclusively of one or more inorganic binders, one or more oxide pigments and one or more solvents.

The coating composition is preferably a coating composition which is liquid under standard conditions (SATP: 25° C., 1.013 bar), which has the advantage of being particularly easy to apply and of leading to particularly fine structures.

DETAILED DESCRIPTION OF THE INVENTION

Figure 1:
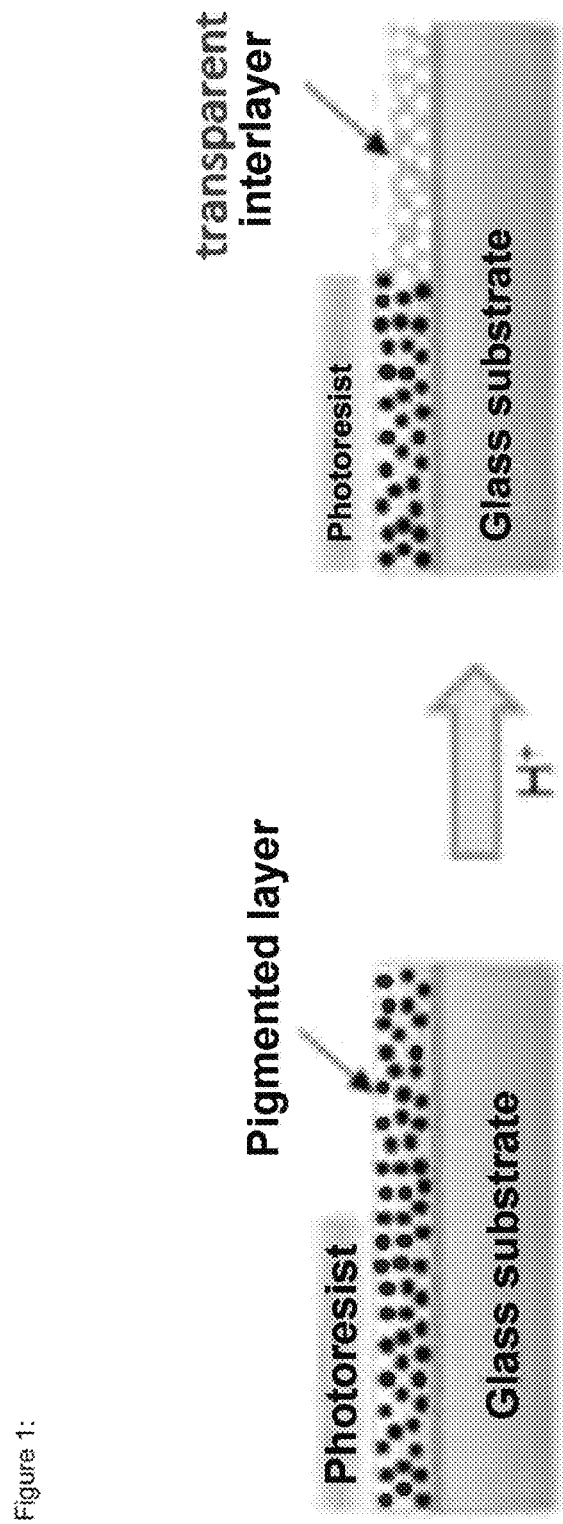
FIG. 1 shows the acid treatment leading to leaching of the oxide pigments out of the coating, which leaves the acid-insoluble coating based on the inorganic binder in place.

The coating composition used comprises at least one inorganic binder. Preferably, the at least one inorganic binder is a binder which, in a formal sense is a condensation product of optionally alkylated alkoxysilanes.

Preferred organic binders have the generic formula $Si_aR^1{}_bO_c(OR^2)_d$ with $a≥2$, $b≥0$, $c≥1$, $d≥5$ and $R^1$ and $R^2$=organic radical.

Corresponding inorganic binders—formally oxyalkoxysilane compounds or alkylated oxyalkoxysilane compounds—are condensation products of alkoxysilanes and optionally alkylated alkoxysilanes and can be prepared therefrom under acid or acid ester catalysis. Reactants used may preferably be alkoxysilanes of the generic formula $Si(OR^2)_4$ with $R^2$=organic radical and alkylated alkoxysilanes of the generic formula $SiR^1(OR^2)_3$ with $R^1$ and $R^2$=organic radical. The corresponding reaction can be conducted particularly efficiently in water. The reaction can be conducted particularly efficiently with phosphoric esters, preferably with monomethyl phosphates. Reactants used may preferably be alkoxysilanes of the generic formula $Si(OR^2)_4$ and alkylated alkoxysilanes $SiR^1(OR^2)_3$ with $R^1$ or $R^2$=—$CH_3$, —$CH_2CH_3$, —$CH_2CH_2CH_3$, —$CH(CH_3)_2$. Even though the reaction is conducted in the presence of water, it is generally the case that, after completion of the reaction, i.e. after formation of a binder, water is present only in very small proportions of typically <5% by weight, especially <2% by weight, further especially <1% by weight, based on the total mass of the coating composition.

Further-preferred inorganic binders thus have the generic formula $Si_aR^1{}_bO_c(OR^2)_d$ with $R^1$ and $R^2$=—$CH_3$, —$CH_2CH_3$, —$CH_2CH_2CH_3$, —$CH(CH_3)_2$, preferably $R^1$ and $R^2$=—$CH_3$ and/or —$CH_2CH_3$, $a≥2$, $b≥0$, $c≥1$ and $d≥5$.

Particularly good coatings which display particularly low brittleness can be achieved when a mixture of $SiCH_3(OCH_2CH_3)_3$ and $Si(OCH_2CH_3)_4$ is used. The resulting binders correspondingly have the $R^1$=—$CH_3$ and $R^2$ radicals=—$CH_2CH_3$.

Of particularly good suitability for production of finely structurable black matrices having particularly homogeneous layers with low surface roughnesses are additionally coating compositions comprising corresponding binders with $a=5$ to 150, preferably $a=20$ to 100, preferably $a=30$ to 80, silicon atoms.

The maximum value for the sum of b+d, especially in the case of low values of a, is close to 4·a. The value of c is at least 1 and is related to the values of a, b and d by the relationship $4·a=b+2·c+d$. Preferably, the ratio of c to a for achievement of particularly good properties of the resulting layer is on average 1.1 to 2.0, further preferably 1.15 to 1.8, most preferably 1.2 to 1.5.

Preferably, the coating compositions of the invention are additionally essentially free of organic binders (i.e. the proportion of organic binder, based on the total mass of binder, is less than or equal to 5% by weight, preferably less than or equal to 2% by weight, further preferably 0% by weight), since they have the great advantage in that case of being usable for thermal steps at up to 800° C.

The inorganic binder is used in the process according to the invention, moreover, for achievement of particularly good results in the coating composition, in proportions of 5% to 75% by weight, further preferably 10% to 45% by weight, based on the total mass of the coating.

The coating composition used in the process according to the invention additionally includes at least one oxide pigment which, after addition of a mixture consisting of 15 ml of 1 M oxalic acid and 15 ml of 20% aqueous hydrochloric acid (HCl) based on 1 g of substance, under standard conditions (SATP: 25° C., 1.013 bar), leads to a temperature increase of at least 4° C.

This exothermic reaction after the addition of the mixture, having a volume of 30 ml, of 15 ml of 1 M oxalic acid and 15 ml of 20% aqueous hydrochloric acid (HCl) to 1 g of oxide pigment, which has the particular feature of an elevated temperature of at least 29° C. 60 seconds after the addition under SATP and subsequent stirring at 200 rpm for the oxide pigments usable in accordance with the invention, in contrast to other oxide pigments, is a pointer to reactivity and hence corresponding suitability of the respective mixed oxide pigment.

Corresponding oxide pigments may be understood to mean i) pigments based on an oxide of an oxidation state of a (semi)metal, ii) pigments based on mixed oxides of a (semi)metal in more than one oxidation state (mixed-valency oxides of a (semi)metal, for example iron oxide $Fe_3O_4$) and iii) pigments based on mixed oxides (mixed-phase oxide pigments) of at least two (semi)metals each in one or more oxidation states. The term "(semi)metals" encompasses metals and semimetals in equal measure.

Preferably, the at least one oxide pigment is a pigment based on a mixed oxide of a (semi)metal in more than one oxidation state (e.g. iron oxide $Fe_3O_4$) and/or a pigment based on mixed oxides (i.e. a mixed-phase oxide pigment) of at least two (semi)metals each in one or more oxidation states. Further preferably, the pigment is a pigment based on mixed oxides of at least two (semi)metals, each of which may again be in one or more oxidation states. Most preferably, the pigment is a pigment based on mixed oxides of at least two metals, of which at least two metals are in different oxidation states (mixed-valency oxides). Corresponding compounds are oxides and/or mixed oxides and may have, for example, a spinel structure or an inverse spinel structure (and hence be monophasic mixed phase pigments), or else take the form of a mixture of different crystal phases.

Particularly good results are achieved with pigments which are mixed iron-manganese oxides. Particular preference is further given to the copper oxide-containing mixed iron-manganese oxides, with which very particularly good results can be achieved. Corresponding "mixed oxide" pigments are understood to mean both monophasic and polyphasic mixed crystal oxides.

Very particularly preferred copper oxide-containing mixed iron-manganese oxides are those obtainable via calcination of manganese(II) oxide (MnO), manganese(III) oxide ($Mn_2O_3$) iron(II) oxide (FeO), iron(III) oxide ($Fe_2O_3$) and copper(II) oxide (CuO). Corresponding mixed oxides are also referred to by the Colour Index (C.I. for short) as "Pigment Black 26". C.I. is a reference work that has existed since 1925 for all commonly used colourants and dye-based chemicals and is a standard work in the field of pigment and dye chemistry. The Colour Index is published by the British Society of Dyers and Colourists and the American Association of Textile Chemists and Colorists.

Corresponding particularly preferred pigments are obtainable under the Black 444 name from The Shepherd Color Company, USA, Daipyroxide Black 9550 from Dainichiseika Color & Chemicals Mfg. Co., Ltd., Japan, Spinel Black 47400 from Kremer Pigmente GmbH Lind Co. KG. Germany and PS 24-3060 PK from Ferro GmbH, Germany. Even though these particularly preferred pigments are referred to as manganese-iron black spinels, it is not certain that these pigments have a spinel structure exclusively or at all.

In addition to the oxide pigments mentioned, it is also possible for further colour pigments to be present in the composition, especially titanium oxide, zinc white, spinel blue, lithopone, barium sulphate, zinc oxide, calcium carbonate, cristobalite or kaolin. Preferably, however, the inventive compositions contain only the above-described oxide pigments which lead to the temperature increase described.

In addition, the composition, for attainment of coatings having particularly good nonconductivity, is preferably carbon-free, meaning that it does not contain any proportions of carbon polymorphs such as carbon black, graphite, activated carbon, carbon dust, fullerenes, graphene and the like. "Not having any proportions of carbon polymorphs" is understood to mean a proportion of carbon polymorphs of not more than 0.5% by weight, preferably of not more than 0.2% by weight, most preferably of not more than 0.1% by weight, based on the total mass of pigment composition weighed out.

The proportion of oxide pigments having the property described in the composition is, preferably, based on the total mass of the composition, 10% to 50%, further preferably 15% to 40% and more preferably 15% to 35% by weight.

The composition additionally comprises at least one solvent. In principle, both organic solvents and water are conceivable as solvents. However, particularly good coatings result when the at least one solvent is an organic solvent or a mixture of organic solvents. Preferably, the organic solvent is an alcohol, an alkyl ester, an alkoxy alcohol and/or an alkoxyalkyl ester. Most preferably, the at least one solvent is 1-methoxy-2-propanol, ethyl lactate, butyl, acetate, ethyl benzoate, propylene glycol monomethyl ether acetate, trkethylene glycol) monoethyl ether (ethyl triglycol, TGEE), ethanol, isopropanol and/or butanol.

Generally, the proportion of the solvent(s) is preferably 20%-80% and further preferably 35%-70% by weight, based on the total mass of the coating.

The composition may additionally include, as well as the essential constituents of inorganic binder, solvent and oxide pigment, further additions and additives as well. For instance, the composition, as well as the at least one oxide pigment, may include further pigments or dyes. Preferably, the inventive composition, however, comprises only oxide pigments as pigment constituents. In addition, the composition may include at least one wetting additive, dispersing additive and/or levelling additive as additive for attainment of positive properties. Particularly preferred additives are additives based on urethane copolymers or polyethers modified, for example, with siloxanes. Particularly preferred additives are the commercially available products having the TEGO Dispers 656 and TEGO Glide 450 names (each from Evonik Goldschmidt GmbH) and BYK 111 name (from Byk Chemie GmbH). It is additionally possible to add particulate $SiO_x$ as filler to the inventive coating composition for achievement of advantageous properties.

Preferably, the composition used in the process according to the invention, for achievement of particularly good coatability, printability and sprayability, has a viscosity of 1 mPa·s to 10 Pa·s, especially 1 mPa·s to 100 mPa·s, determined to DIN 53019 Part 1 to 2 and measured at 20° C. Corresponding viscosities can be established by adding polymers, cellulose derivatives, or $SiO_2$ available under the Aerosil trade name, and especially preferably by means of PMMA, polyvinyl alcohol, urethane thickeners or polyacrylate thickeners.

Additions and additives, if they are present at all, are used typically in proportions of not more than 10%, preferably not more than 3%, by weight, based on the total mass of the composition.

The coating compositions used can be structured very efficiently, especially when one or more of the preferred embodiments described for inorganic binder, oxide pigment and solvent are chosen. In addition, the coating compositions described have the advantage that they can be very finely structured successfully even with weak acids or weak acid mixtures, and hence there is no requirement for etching via, for example, highly technical vacuum processes (as, for example, in the case of dry etching) or with strong acids or acids that cause a high degree of damage to health or the environment (such as hydrofluoric acid).

The coating compositions described, when used in the process according to the invention, lead not only to the desired advantages but surprisingly additionally also to a particularly high optical density of the resulting coating.

The application of the coating composition to the substrate can be effected either over the fu area or in a structured manner. The process can be conducted in a particularly simple and hence advantageous manner when the coating composition is applied over the full area.

The inventive coating composition can be applied to the substrate in any desired manner principle.

Preferably, the coating composition is applied to the substrate by a coating process selected from printing processes (especially flexographic/gravure printing, inkjet printing—most preferably continuous, thermal or piezo inkjet printing, offset printing, digital offset printing and screen printing), spraying processes, spin-coating processes, dip-coating processes, and processes selected from meniscus coating, slit coating, slot-die coating and curtain coating. Most preferably, the coating composition is applied by means of a printing process or spin-coating process. Especially suitable printing processes are inkjet and liquid toner processes (for example HP Indigo), since these processes are of particularly good suitability for a structured application of the printing material. Most, preferably, the process according to the invention is a spin-coating process, since it is thus possible to achieve a full-area coating in a particularly simple manner.

If the liquid coating composition is applied by spin-coating, this is preferably effected at speeds between 100 and 5000 rpm. Preferably, coating is first of all effected at a low spin speed of 100 to 1000 rpm over a period of 5 s to 30 s, and then the spin speed is increased once again to 1500 to 5000 rpm for a period of 10 s to 120 s.

In principle, when suitable properties are chosen, it is possible to apply the photoresist directly after the application of the coating composition.

Preferably, however, after the application of the liquid coating composition, the solvent is removed by drying prior to the application of the photoresist. In addition, this prevents cracking of the layer in the later curing step and improves the adhesion of the coating composition on the substrate. The drying is preferably effected thermally at standard pressure at temperatures between 50 and 150° C. within drying times between 30 s and one hour. Further preferably, the drying is effected by means of heating to 90-120° C. (at 1013 mbar) over a period of 5-10 minutes. The corresponding optional drying step can also be referred to as "pre-annealing".

After the application of the coating composition of the subsequent drying, the resulting film is coated partially with a photoresist. This can be done either by applying the coating over the full area and selectively structuring it thereafter (for example by means of a mask process and subsequent removal of the desired regions) or by structured application of the photoresist (for example via a printing process). Ways and means of doing this are known to those skilled in the art, as is the suitability of the respective commercially available photoresists. A particularly preferred commercial product is the photoresist AZ 1514H from MicroChemicals GmbH.

After the partial application of the photoresist, the result is a coated substrate which exhibits a coating film applied over the full area or in a structure, which is in turn partially covered by a structured photoresist layer. The regions of the coating film covered with structured photoresist correspond to the desired pigmented coating, for example to the black matrix.

After the partial application of the photoresist, the substrate coated with the coating composition and the photoresist is treated with an acid. It has been found that, surprisingly, the pigments that exhibit the temperature rise mentioned can be leached out of the coating composition films not covered by photoresist. The treatment with acid thus makes the coating applied beforehand transparent.

An acid in the context of the present invention is understood to mean an inorganic acid or an organic acid. These are chemical compounds which form protons ($H^+$ ions) and have a pH of less than 7.00 in aqueous solution. Acids usable with preference have a pH between 1 and 6, further preferably between 1 and 3. Acids usable with preference are hydrochloric acid, sulphuric acid, phosphoric acid, nitric acid, hydrofluoric acid, silicic acid, carbonic acid, acetic acid, citric acid and benzoic acid. Acids usable with preference are aqueous oxalic acid in a concentration of 0.3 to 2.5 mol/l and aqueous hydrochloric acid of 3.0-12.0 mol/l (the latter corresponding to 10%-35% by weight). It is also possible to use mixtures of the aforementioned acids. Very particularly good results are achieved by mixtures in a ratio of 1:2 to 2:1 (parts by volume) of 1 M aqueous oxalic acid and 6 M aqueous HCl.

The treatment with acid can be effected in any desired, manner. Preferably, the coated substrate is dipped into an appropriate dip tank. Preferred treatment times or immersion times are 1 to 15 minutes, further preferably 3 to 5 minutes. The treatment with acid is further preferably effected under standard conditions (SATP: 25° C., 1.013 bar).

The acid treatment leads to leaching of the oxide pigments mentioned out of the coating (cf. FIG. 1). This leaves the acid-insoluble, coating based on the inorganic binder in place. The slightly porous surface thereof is preferentially suitable for the application of further coatings, especially of antireflection or antifingerprint coatings.

For attainment of corresponding preferred coated substrates which still have a colourless inorganic coating, the photoresist is thus removed after the acid treatment and the remaining coating is cured. Preferably, the photoresist can be removed by dissolution in organic solvents. More preferably, the photoresist can be removed with solvents, for example acetone.

However, particularly smooth and hence likewise preferred layers are the result when the coating which has been freed of pigment after the acid treatment is removed partially or fully, preferably fully. The pigment-free inorganic coating can preferably be removed with bases.

A base in the context of the present invention comprises chemical compounds which form hydroxide ions (OH ions) and have a pH of greater than 7.00 in aqueous solution. Bases usable with preference have a pH between 8 and 14, further preferably between 11 and 14 Abase used with preference is aqueous NaOH in concentrations of 0.02 to 1.0 M.

The treatment with base can be effected in any desired manner. Preferably, the coated substrate is dipped into an appropriate dip tank. Preferred treatment times or immersion times are 10 seconds to 5 minutes, further preferably 10 to 90 seconds. The treatment with base is further preferably effected under standard conditions.

Figure 2:
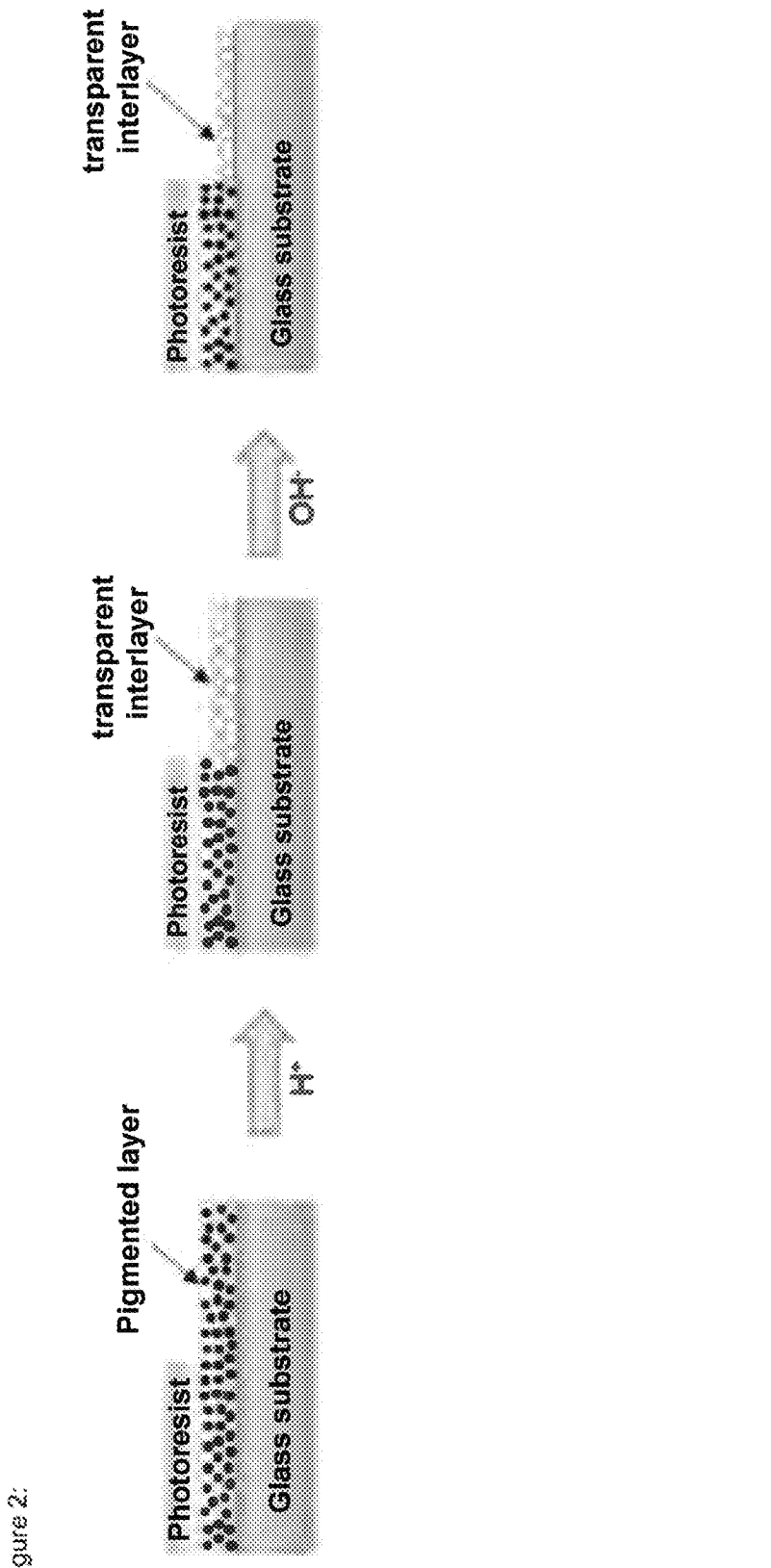
FIG. 2 shows a preferred embodiment where the pigment-free coating is removed partially after the acid treatment.
Figure 3:
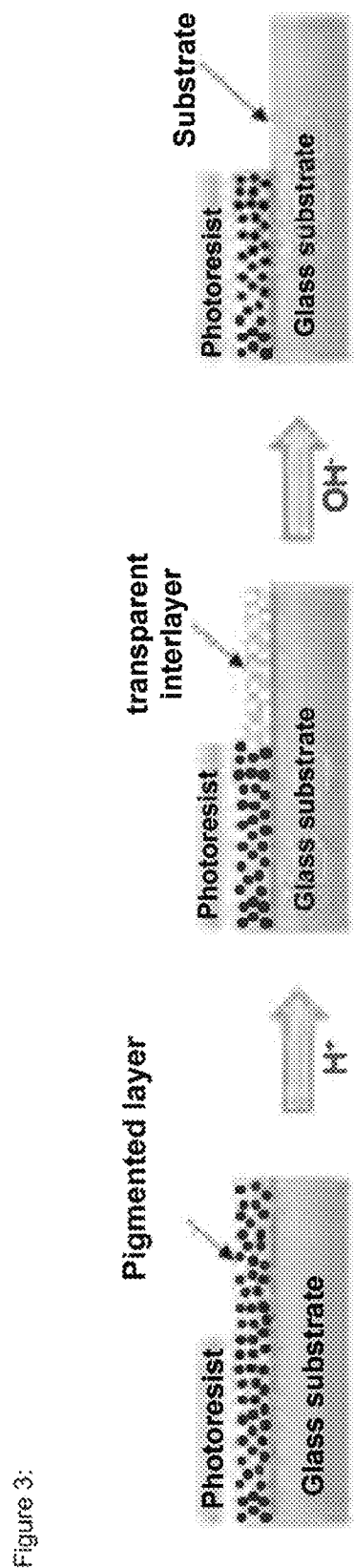
FIG. 3 shows another preferred embodiment where the pigment-free coating is removed fully after the acid treatment.

In a likewise preferred embodiment of the present invention, after the acid treatment, the pigment-free coating is removed partially (cf. FIG. 2) or fully (FIG. 3), then the photoresist is removed and, finally, the remaining coating is cured. Particularly smooth and hence particularly preferred coatings are the result when the pigment-free coating is fully removed.

The subsequent curing is effected, irrespective of whether the pigment-free coating is removed partially or fully or not, preferably at a pressure of 1013 mbar over a period of 1 minute to 1 hour at temperatures of 200° C. to 800° C., preferably over a period of 1-10 minutes at temperatures of 300-400° C.

The present invention further provides the structured layers producible by the process according to the invention.

The present invention further provides for the use of the layers producible by the process according to the invention in electronic components and in automobile construction.

EXAMPLES

Example 1: Making Up the Sol-Gel Matrix

TEOS (15.44 wt %) and MTES (66.18 wt %) are mixed.
Subsequently added thereto are demineralized $H_2O$ (9.18 wt %) and Hordaphos CCMS phosphoric ester (0.02 wt %).
The mixture is stirred on a stirrer plate overnight.
Then demineralized $H_2O$ (9.18 wt %) is added again.
The sol-gel mixture ripens for 2 days (with stirring).

Example 2: Production of the Dispersion

The 1-methoxy-2-propanol solvent (57.85 wt %) is initially charged, in order to dilute the sol-gel mixture to the suitable solids concentration.
Then 15.03 wt % of the sol-gel mixture is added.
The TEGO Dispers 710 dispersing and wetting additive (2.10 wt %) is added.
Lastly, the spinel black "deepest black (Fe,Mn)(Fe, Mn)$_2$O$_4$" from Kremer Pigmente GmbH & Co. KG is added (amount 25.02 wt %).
For the dispersion by means of an agitated mixer (Scandex), about 30 g of zirconium oxide grinding beads of size 0.4 to 0.6 mm are added.
The dispersion mixture is dispersed for at least 2 hours, but better 10 hours, in the agitated mixer.
After the dispersion, the grinding beads are removed by sedimentation or filtering.

Example 3: Substrate Coating

As substrates to be coated, glass substrates are used.
Prior to coating, the glass substrates are cleaned with organic solvent (isopropanol) rinsed with DI water and then blown dry with nitrogen.
The dispersion is applied by means, of a spin-coating method with the following parameters: 10 sec at 500 rpm, then 30 sec at 2000 rpm.
The structuring is preceded by a prebake step, in order to gradually remove the solvent and, prevent cracking of the layer (10 min at 100° C. on the hotplate).

Example 4: Application of the Photoresist; UV Exposure

By means of a spin-coating method, the photoresist AZ 1514H from MicroChemicais GmbH is applied to the coated glass substrates with the following parameters: 30 sec at 2000 rpm.
The curing takes place on the hotplate at 180° C. for 80 seconds.
After the curing, the substrates are exposed to UV light through a mask in the mask aligner for 10 seconds.

Example 5: Development

The exposed glass substrates are developed for 2.5 minutes in a bath containing AZ Developer from Micro-Chem GmbH.

Thereafter, the glass substrates are rinsed with DI water and blown dry with nitrogen.

Example 6: Structuring

The glass substrates are treated in a first step in a bath consisting of 1 M oxalic, acid and 20% aqueous hydrochloric acid (1:1) for 5 minute
Thereafter, the glass substrates are rinsed with DI water and blown dry with nitrogen:
The glass substrates are treated in a second step in a bath consisting of 0.5 M sodium hydroxide solution for 40 seconds.
Thereafter, the glass substrates are rinsed with DI water and blown dry with nitrogen.

Example 7: Curing

The curing takes place on the hotplate at C for 5 minutes.

The invention claimed is:

1. A process for producing a structured coating, comprising:
    applying
    a. a coating composition comprising
        i. at least one inorganic binder,
        ii. at least one oxide pigment which, after addition of a mixture consisting of 15 ml of 1 M oxalic acid and 15 ml of 20% aqueous hydrochloric acid based on 1 g of substance, under standard conditions, leads to a temperature rise of at least 4° C., and
        iii. at least one solvent
    to a substrate, to obtain a coating composition film on the substrate,
    b. partially coating the resulting coating composition film with a photoresist, and
    c. treating the substrate coated with the coating composition film and the photoresist with an acid resulting in a leaching out of said at least one oxide pigment from said coating composition film leaving a leached layer.

2. The process according to claim 1, wherein the inorganic binder has the generic formula $Si_aR^1{}_bO_c(OR^2)_d$ with $a \geq 2$, $b \geq 0$, $c \geq 1$, $d \geq 5$ and $R^1$ and $R^2$=organic radical.

3. The process according to claim 1, wherein the pigment is a pigment based on a mixed oxide of a (semi)metal in more than one oxidation state and/or a pigment based on at least two mixed oxides of at least two (semi)metals each in one or more oxidation states.

4. The process according to claim 3, wherein said pigment is a mixed iron-manganese oxide.

5. The process according to claim 4, wherein said pigment is a copper-containing mixed iron-manganese oxide.

6. The process according to claim 5, wherein the mixed iron-manganese oxide is obtainable via a calcination of manganese(II) oxide, manganese(III) oxide, iron(II) oxide and iron(III) oxide and copper(II) oxide.

7. The process according to claim 6, wherein the pigment is assigned to the group of pigments having the Colour Index designation Pigment Black 26.

8. The process according to claim 1, wherein a proportion of oxide pigment, based on the total mass of the composition, is 10%-50% by weight.

9. The process according to claim 1, wherein the at least one solvent is selected from the group consisting of an alcohol, an alkyl ester, an alkoxy alcohol, an alkoxyalkyl ester and mixtures thereof.

10. The process according to claim 1, wherein the acid used is aqueous oxalic acid in a concentration of 0.3 to 2.5 mol/l, aqueous hydrochloric acid 3.0-12.0 mol/l or mixtures having proportion by volume ratios of 1:2 to 2:1 of 1 M aqueous oxalic acid and 6 M aqueous HCl.

11. The process according to claim 1, wherein after the acid treatment
 a. the photoresist is removed, and
 b. the coating composition is cured.

12. The process according to claim 1, wherein after the acid treatment
 a. a portion of said coating composition film which is not coated with said photoresist is removed partially or completely,
 b. the photoresist is removed, and
 c. the coating composition is cured.

13. The process according to claim 1, wherein as a result of acid treatment portions of said coating composition film exposed to acid becomes transparent.

14. The process according to claim 1, wherein as a result of acid treatment, portions of said coating composition film exposed to acid become free of oxide pigment.

15. The process according to claim 1, wherein as a result of acid treatment portions of said coating composition film exposed to acid are not etched.

\* \* \* \* \*